United States Patent [19]
Zertani et al.

[11] Patent Number: 5,504,515
[45] Date of Patent: Apr. 2, 1996

[54] LASER EXPOSURE APPARATUS FOR PRINTING FORMS TO BE IMAGEWISE EXPOSED

[75] Inventors: Rudolf Zertani, Mainz; Helmuth Haberhauer, Taunusstein; Norbert Kraemer, Heidenrod, all of Germany

[73] Assignee: Hoechst Aktiengesellschaft, Frankfurt am Main, Germany

[21] Appl. No.: 98,802

[22] Filed: Jul. 28, 1993

[30] Foreign Application Priority Data

Aug. 5, 1992 [DE] Germany .......................... 42 25 828.6

[51] Int. Cl.⁶ ...................................................... B41J 2/47
[52] U.S. Cl. .......................... 347/235; 347/237; 347/238
[58] Field of Search ................................... 347/235, 237, 347/233, 238, 245, 241, 250, 255, 256, 262, 264

[56] References Cited

U.S. PATENT DOCUMENTS

| | | | |
|---|---|---|---|
| 3,144,331 | 8/1964 | Thomnes | 96/27 |
| 3,859,091 | 1/1975 | Wessells et al. | 96/36.3 |
| 4,298,803 | 11/1981 | Matsuura et al. | 250/492.2 |
| 4,716,097 | 12/1987 | Weed | 430/327 |
| 4,796,038 | 1/1989 | Allen et al. | 347/255 |
| 4,864,326 | 9/1989 | Kawamura et al. | 347/240 |
| 4,884,857 | 12/1989 | Prakash et al. | 359/204 |

FOREIGN PATENT DOCUMENTS

| | | |
|---|---|---|
| 1214085 | 4/1966 | Germany . |
| 2412571 | 11/1974 | Germany . |

*Primary Examiner*—Mark J. Reinhart
*Attorney, Agent, or Firm*—Foley & Lardner

[57] ABSTRACT

A laser exposure apparatus utilizing a laser, beam divider, modulator, beam expander, beam combiner, polygonal mirror and also a scanner lens, path-folding mirror and a reference mask. The laser beam is divided in the beam divider into a writing beam and a reference beam, both of which are brought together by means of two path-folding mirrors and a beam combiner. The writing beam is then guided through an exposure slit onto a printing form by a path-folding mirror. One additional exposure device is disposed upstream and/or downstream of the exposure slot, and in the direction of conveyance of the printing form. Only one of the additional exposure devices is switched on during operation, so that either a preexposure or an afterexposure is accomplished in addition to the laser main exposure of the printing form.

14 Claims, 3 Drawing Sheets

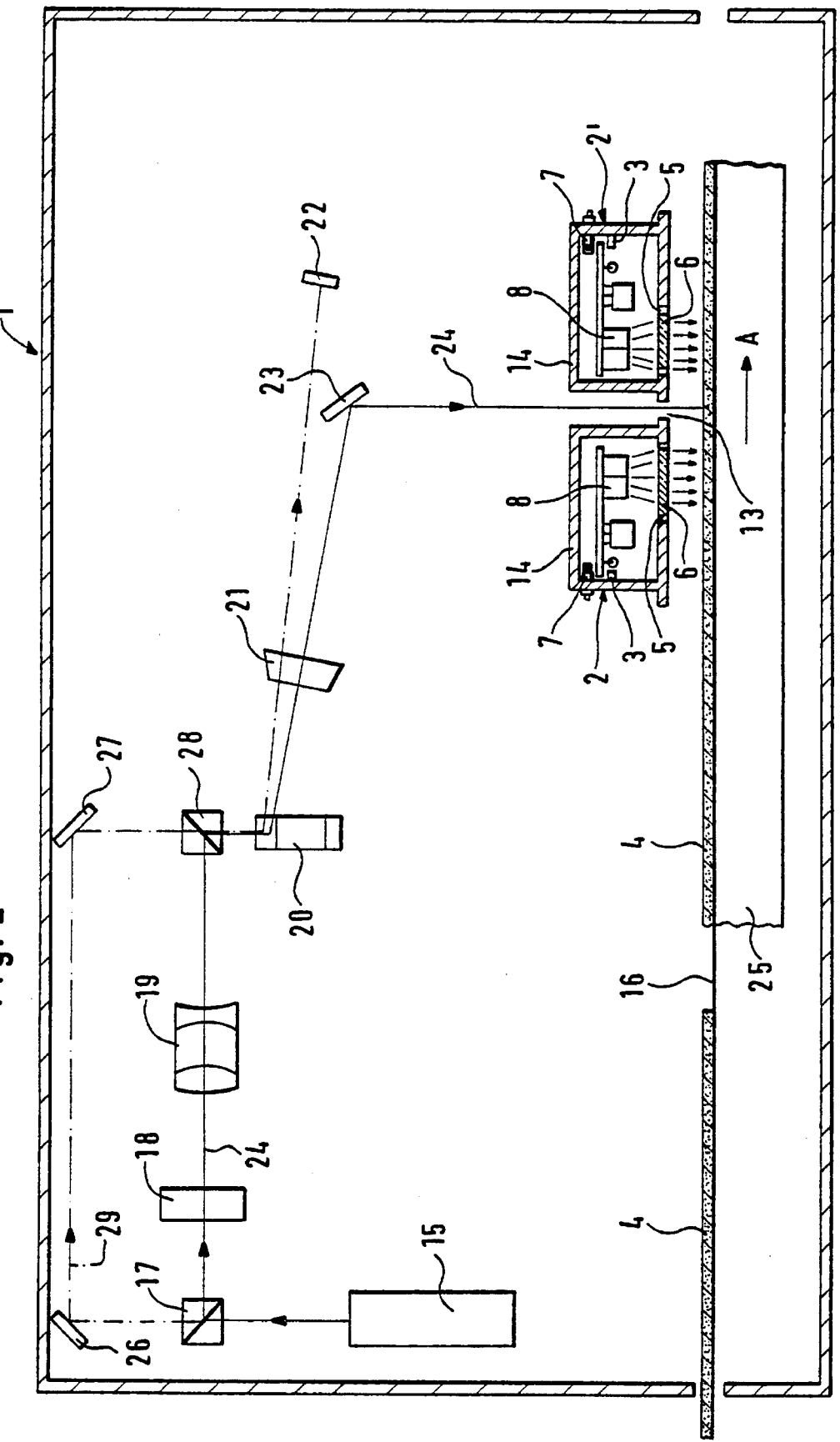

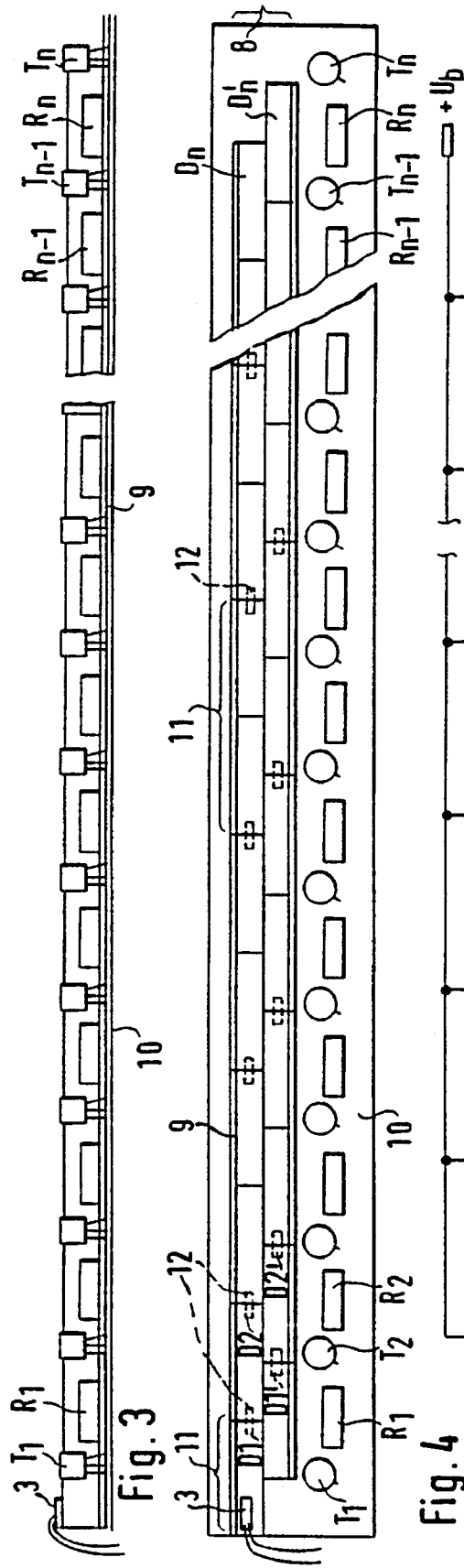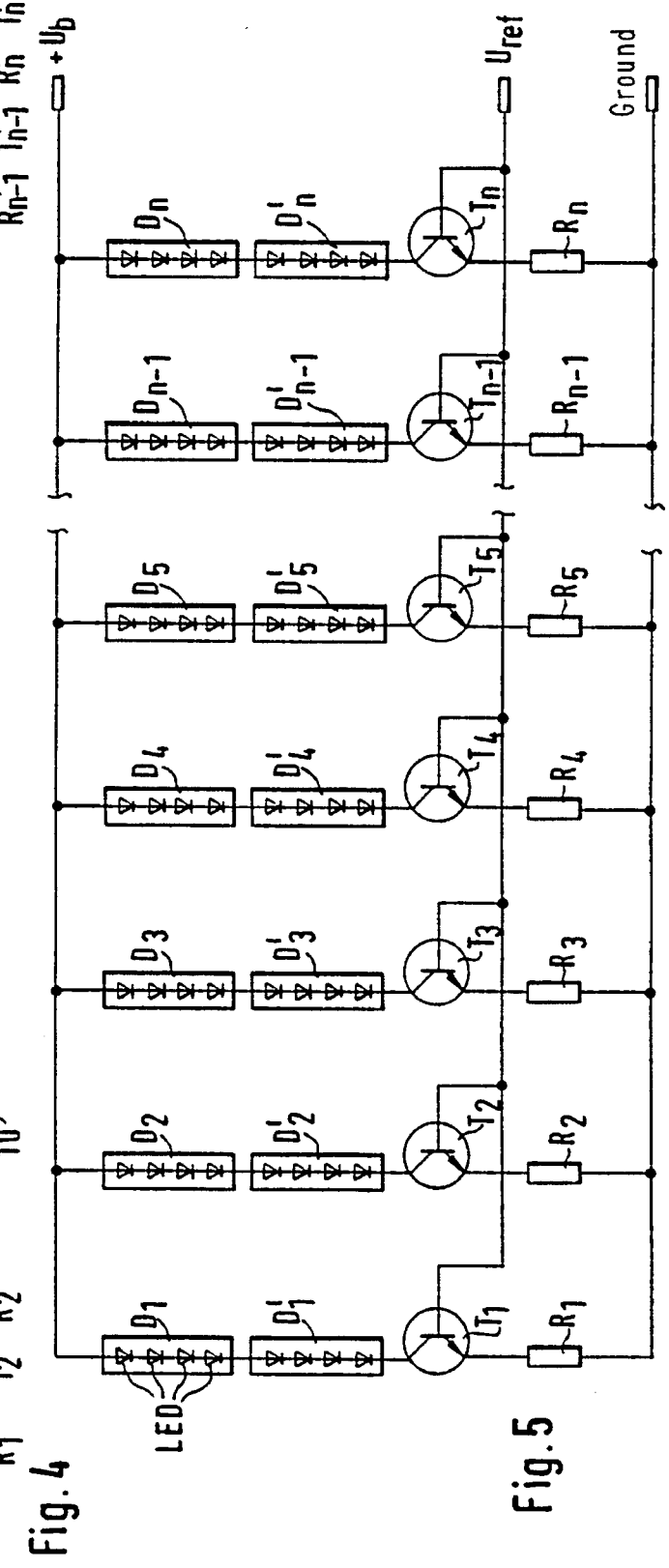

LASER EXPOSURE APPARATUS FOR PRINTING FORMS TO BE IMAGEWISE EXPOSED

BACKGROUND OF THE INVENTION

The present invention relates to a laser exposure apparatus for printing forms or printing plates to be imagewise exposed. More particularly, the present invention relates to a laser exposure apparatus for printing forms to be imagewise exposed and comprising a laser, beam divider, modulator, beam expander, polygonal mirror, scanner lens, reference mask and path-folding mirror.

From DE-B 12 14 085 (U.S. Pat. No. 3,144,331) it is known to expose photopolymerizable recording materials which have been applied as a photosensitive layer to a printing plate support and whose sensitivity has fallen due to absorption of molecular oxygen, using 70 to 98% of the radiation dose of an actinic radiation which would be necessary with uniform incidence to initiate a photopolymerization in order to restore the sensitivity. The exposure is carried out through the printing plate support, which is, for example, transparent, an actinic radiation being used which has a wavelength such that only 10 to 70% of the radiation is absorbed by the photopolymerizable layer. In this process, exposure is in principle carried out first diffusely and then imagewise. The diffuse or preexposure is carried out with lower intensity, namely with 70% to 98% of the radiation intensity which is necessary to achieve the full exposure action. This preexposure is then followed by the imagewise exposure with full radiation intensity.

U.S. Pat. No. 4,298,803 discloses a process in which a photoresist layer is preexposed with an intensity which is less than the critical exposure intensity at which the photoresist can be substantially dissolved away at the exposed points. After this preexposure, the imagewise exposure of the photoresist layer is carried out. The sequence of the two exposures can be interchanged. In both cases, the photosensitivity of the photoresist is improved, which considerably shortens the processing time. In the device used for this process, both the imagewise exposure and the preexposure or afterexposure of the photoresist can be carried out by means of an electron beam, or of a UV or X-ray source.

U.S. Pat. No. 4,716,097 likewise discloses a process in which a photopolymeric layer containing a dyestuff is first diffusely and then imagewise exposed to light having a wavelength above 400 nm and an intensity of at least 1500 lumens/m$^2$.

German Offenlegungsschrift DE-A 24 12 571 discloses a process for curing a light-curable polymer layer of a printing plate, in which exposure is first carried out diffusely for a short time and then imagewise until the polymer layer is virtually completely cured in the exposed areas. The diffuse exposure duration is not more than 90% of the time within which the complete curing of the polymer layer takes place with equal intensity of radiation both for the preexposure and for the imagewise exposure.

SUMMARY OF THE INVENTION

Accordingly, it is an object of the present invention to provide a laser exposure apparatus for printing forms to be imagewise exposed in such a way that the radiation sensitivity of the photopolymerizable recording layer of the printing form is increased and the information loss can be kept low, in each case relative to the exposure in a laser exposure apparatus having a laser as sole exposure source.

In accomplishing these objects and others, there has been provided according to one aspect of the present invention a laser exposure apparatus having a laser light source for producing a beam of light together with means for splitting the beam into separate writing and reference beams. The writing beam passes through a modulator and is then recombined with the reference beam. A polygonal mirror and path-folding mirror further direct the writing beam onto a printing form to produce an imagewise exposure. The laser exposure apparatus is further provided with at least one additional exposure device. The additional exposure device is disposed in a closed housing near an exposure slit through which the laser beam of the laser strikes the printing form, and a control system is provided for establishing a time interval between an additional exposure and the main exposure of between 1 second and 15 minutes.

In one preferred embodiment of the invention, the additional exposure device is mounted upstream of the exposure slit in the direction of movement of the printing form through the laser exposure apparatus.

With this arrangement, a preexposure takes place before the actual laser exposure of the printing form. Equally, the invention can be embodied in such a way that the additional exposure device is disposed downstream of the exposure slit in the direction of movement of the printing form through the laser exposure apparatus in order to carry out an afterexposure of the laser-exposed printing form. In a further development of the invention, an additional exposure device is present in each case upstream and downstream of the exposure slit, and only one of the additional exposure devices is switched on in each case during the passage of a printing form through the laser exposure apparatus.

Still another embodiment of the invention has been provided in which a linear LED arrangement is employed as an additional exposure device, and means for varying the luminosity of the device are provided.

Additionally, there has been provided exposure of a photosensitive printing form in an imagewise manner. A linear portion of the printing form is first illuminated with a diffuse light source. A laser beam is produced and split into a writing and a reference beam. The writing beam is modulated in response to a synchronized signal, expanded, and subsequently recombined with the reference beam. The reference beam is directed onto a reference mask containing a patterned glass plate, a diffuser and a row of photodiodes. The synchronizing signal is produced as a result of the output from the photodiodes, and then used to control further modulation of the writing beam. Finally, the modulated writing beam is directed onto the preexposed portion of the printing form after a delay of between one second and 15 minutes.

Further objects, features and advantages of the present invention will become apparent from the detailed description of preferred embodiments which follows, when considered together with the attached figures of drawing.

BRIEF DESCRIPTION OF THE DRAWINGS

The invention is explained in greater detail below by reference to the drawings, in which:

FIG. 2 shows a diagrammatic sectional view of a laser exposure apparatus having additional exposure devices for the preexposure or afterexposure of the printing form; and FIGS. 3 through 5 show a side view, plan view and circuit schematic corresponding to the radiation source of an additional exposure device according to the present invention.

DETAILED DESCRIPTION OF PREFERRED EMBODIMENTS

Figure 1:
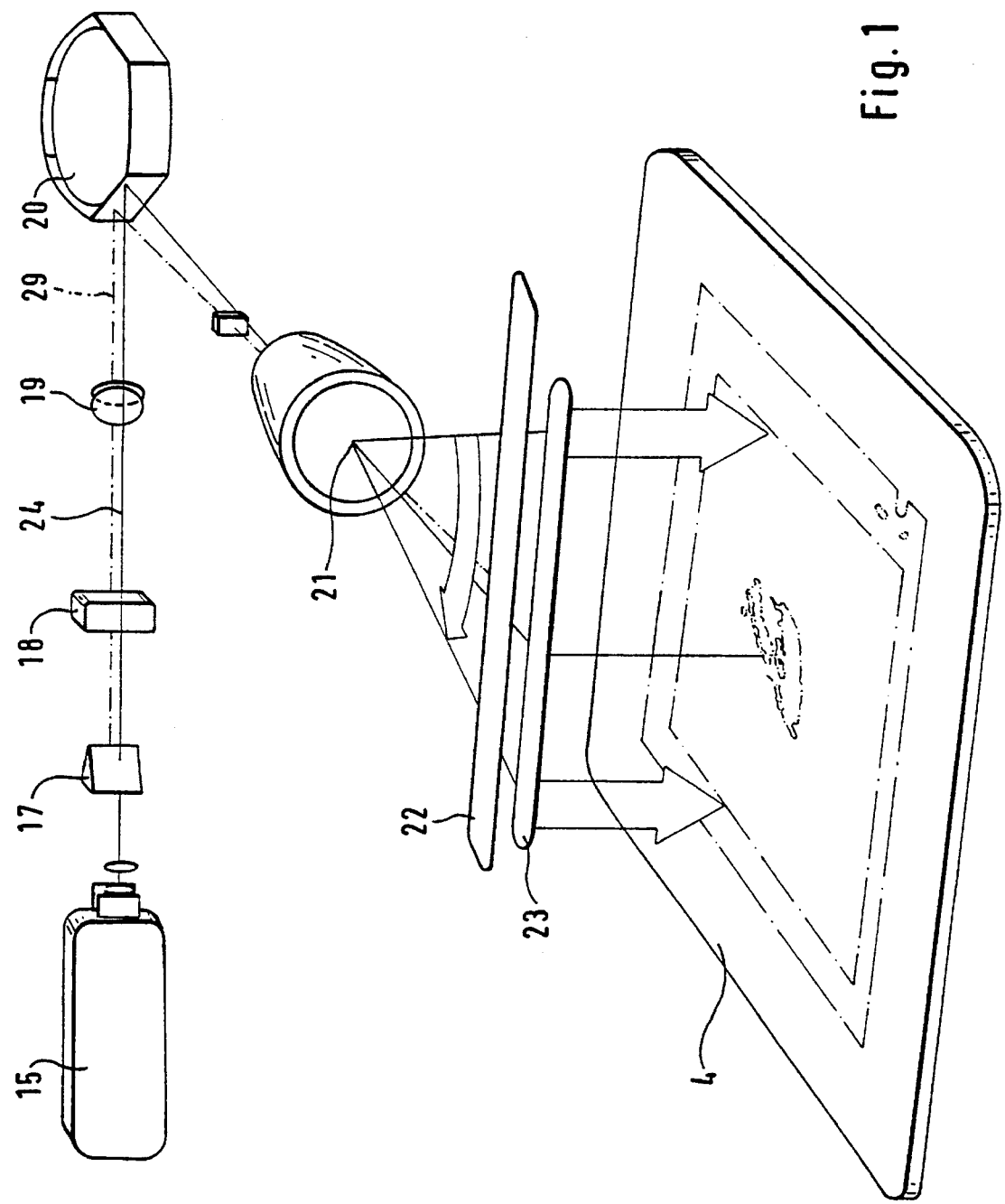
FIG. 1 shows a diagrammatic perspective representation of the main or laser exposure of a printing form in a laser exposure apparatus according to the invention.

The laser exposure apparatus according to the invention is used to expose photopolymer-coated printing forms, in particular highly photosensitive laser plates, in which process, as a result of the preexposure or afterexposure with light of very low and very uniform intensity, the photosensitivity of the printing forms treated in this way can be increased appreciably. For this purpose, the unexposed printing forms which are exposed, for example after preexposure has been carried out, by a laser having a wavelength of 488 nm or 514 nm, are preexposed with very low intensity with the aid of the additional exposure device to light of a wavelength of $\lambda=565\pm20$ nm. An advantage of this additional exposure device is that the luminosity of its radiation source can be adjusted within very wide limits.

The elements, shown in a diagrammatic perspective representation in FIG. 1, for a laser exposure of a printing form 4, for example a negative laser plate Ozasol N90 supplied by HOECHST Aktiengesellschaft, Frankfurt/Main, Germany, comprise a laser 15, a beam divider 17, a modulator 18 for the reflected laser beam or writing beam 24, a beam expander 19, a rotating polygonal mirror 20 which the writing beam 24 and the unreflected laser beam or reference beam 29 strike after being brought together, a reference mask 22 and a path-folding mirror 23 which guides the writing beam onto the printing form 4. Such a laser exposure system is used for the main exposure of a printing form 4 in a laser exposure apparatus 1 such as that shown diagrammatically in sectional view in FIG. 2. The same elements as in FIG. 1 are provided with the same reference numerals in FIG. 2. The laser beam of the laser 15 is divided in the beam divider 17 into the reflected laser beam or writing beam 24 (shown in continuous lines), and into the unreflected laser beam or reference beam 29, (shown by dotted lines). The writing beam 24 passes through the modulator 18 which allows through or blocks the writing beam 24 in accordance with a control signal. The control signal is supplied by a data memory in which the information of the image to be reproduced is stored in binary form. The writing beam 24 then passes through the beam expander 19, comprising a system of two lenses which can be moved towards one another to focus the writing beam 24. Downstream of the beam expander 19, the writing beam strikes a beam combiner 28 and is brought together by the latter with the reference beam 29, which, after passing through the beam divider 17, is guided onto the beam combiner 28 by path-folding mirrors 26, 27. The beam combiner 28 guides writing beam 24 and reference beam 29 onto the polygonal mirror 20 which guides the writing beam 24 over the width of the printing form 4 as a result of its rotation. Downstream of the polygonal mirror 20, the two beams 24, 29 pass through a scanner or scanning lens 21 which ensures that arc-like curvature of the beams 24, 29 due to the polygonal mirror is smoothed out so that the beams travel on in a straight line after passing through the scanning lens. Downstream of the scanning lens 21, the writing beam 24 strikes the path-folding mirror 23 which guides it vertically downwardly through an exposure slit 13 onto the printing form 4 which passes through the laser exposure apparatus 1 in the direction of arrow A and which is exposed by the writing beam 24. The reference beam 29 strikes the reference mask 22 which comprises a glass plate having a broken-line pattern, diffuser plate and a row of diodes. The diffuser plate evens out the radiation intensity of the reference beam 29 that passes through the broken-line pattern and strikes one of the diodes, which supplies an appropriate synchronization signal to the modulator 18 in order to synchronize the opening and closing of the latter, with the control signal being applied in each case from the above-mentioned data memory.

Each of the additional exposure devices 2, 2' shown diagrammatically in section in FIG. 2 has a housing 14 which is closed off at the bottom by a plate, which is a light scattering plate 6 mounted in a housing opening 5 of the underside of the housing. Printing forms 4, two of which are diagrammatically shown in FIG. 2, travel along a conveyance track 16 in the direction of arrow A past the additional exposure devices 2, 2' and underneath the latter. An electronic control 7 for a radiation source in the form of a linear LED arrangement 8 is accommodated in the housing 14. The luminosity of the radiation source is measured by a sensor 3 which is mounted on the radiation side of the linear LED arrangement.

In FIG. 2, two additional exposure devices 2, 2' for the preexposure and afterexposure of the printing form 4 are disposed on both sides of the exposure slit 13. Obviously, the laser exposure apparatus 1 may also be equipped only with one of the two additional exposure devices 2, 2', either one for the preexposure only or one for the afterexposure only. As a result of the preexposure, the photopolymerizable recording layer of the printing form 4 becomes more photosensitive since it begins to crosslink at a lower potential than in the case of the main exposure. The information loss, in particular in the case of narrow information ranges, the so-called peak-point information, is kept low as a result of the incipient crosslinking during the preexposure.

If an afterexposure is carried out as a second exposure, the photosensitivity of the printing forms is generally not increased as considerably as in the case of preexposure. A possible explanation could be that the crosslinking remains smaller compared with preexposure since fewer free radicals are formed because the oxygen concentration remains constant. However, it is the case both for preexposure and for afterexposure that the photosensitivity of the printing form 4 is increased, when compared with the exclusive main exposure by a laser beam.

Together with the light scattering plate, the linear LED arrangement 8 provides for the full area diffuse exposure of the printing form 4. This linear LED arrangement 8 comprises at least two rows, offset with respect to one another, of LED modules $D_1, D_2, \ldots D_n$ and $D_1', D_2' \ldots D_n'$, as shown in FIGS. 4 and 5, and is situated in a closed housing 14 of the additional exposure device 2. At the bottom, in the direction of the conveyance track 16 for printing forms, the housing 14 has the exposure opening 5 which is covered by the light scattering plate 6.

The single module $D_1, \ldots D_n, D_1' \ldots D_n'$ generally comprises four light-emitting diodes (LEDs) which are connected in series, as shown in FIG. 5. Two modules $D_1, D_1'; D_2, D_2' \ldots D_n, D_n'$ are in each case connected in series and are fed with a reference voltage $U_{ref}$ by a current source, which is not shown. Two modules connected in series are in each case controlled by an electrical circuit comprising transistor $T_i$ and current-limiting resistor $R_i$, where i=1, 2, . . . n. The resistor $R_i$ may be a fixed resistor or a variable resistor in the form of a potentiometer. The current source applies the reference voltage $U_{ref}$ to the bases of all the transistors $T_i$, which are connected in parallel. The resistors $R_i$, which are likewise connected in parallel, limit the emitter currents of the transistors $T_i$. The reference voltage $U_{ref}$ is a direct voltage in the range from about 0 to 3 V, in which case a base-emitter current $I_{BE}$ of about 0 to 30 mA flows, or it is a square-wave voltage in the range from about 0 to 6 V, with a base-emitter current $I_{BE}$ of about 0 to 60 mA, and a duty cycle of about 1:2. The current source of the reference voltage $U_{ref}$ supplies a current in the order of magnitude of about 100 mA and may, for example, be a D/A converter having a buffer stage, or a separate control circuit.

The effective luminosity of the linear LED arrangement 8 is measured by the sensor 3. In order to maintain a uniform illumination over the entire width of the linear LED arrangement 8, LED modules from one manufacturer are used. If differences in brightness nevertheless occur between the individual modules, they are equalized by altering the associated resistor $R_i$.

The LED modules $D_1$, $D_1'$, ... $D_n$, $D_n'$ are disposed on segments 11 which have equal or different lengths and are plugged together by means of plug contacts 12 to form a printed circuit board 9, as can be seen from FIG. 4. A single module or two to four modules may be disposed on the single segment 11. The plug contacts 12 are indicated by dotted lines in FIG. 4. One segment 11, in each case having one module and two modules in the upper row of the linear LED arrangement 8, is marked by a curved bracket. The plugged-together printed circuit board 9 is mounted on a base printed circuit board 10 on which the transistors $T_i$ and resistors $R_i$ are also disposed. Since the individual segments may have different lengths, the row length can be matched to the width of the printing form to be exposed. As a result of the segmented structure of the linear LED arrangement 8, a rapid replacement is possible in the event of a failure of one or more LED modules since the functioning components do not have to be demounted. No spectral alteration, i.e. no displacement of the wavelength range emitted, occurs with the ageing of the LED. As a result of the current control of the LED modules, a uniform luminous power can be set over the entire length of the linear LED arrangement 8, which is operated by low voltage.

The illuminance of the linear LED arrangement 8 of the additional exposure devices 2, 2' can be infinitely varied electronically to precisely dose the amount of light applied to the printing form 4 between 0% and 100% of the maximum illuminance. The illuminance of said linear LED arrangement 8 is indicated digitally, the sensor 3 being mounted in the interior of the housing to measure the illuminance. The closed nature of the housing prevents the occurrence of external unwanted radiation which could adversely affect the measurement of the illuminance by means of the sensor 3 in an undesirable way.

The illuminance of the linear LED arrangement 8 is set by the electronic control 7, which is shown diagrammatically above the linear LED arrangement 8.

The spectral distribution of the linear LED arrangement 8 is in the wavelength region of about 565± 20 nm.

The sensor 3 for measuring the illuminance is normally a photodiode which is situated in the housing 14 of the additional exposure device 2 and is thereby screened from any unwanted radiation such as, for example, daylight entering the housing 14. The photodiode is expediently mounted above the printed circuit board 9 (cf. FIG. 3).

The additional exposure devices 2, 2' achieve the advantages that the linear LED arrangement 8 generates a very uniform exposure intensity over the working width of the printing form 4, and the exposure intensity of the LED modules or of the linear LED arrangement 8 can be infinitely varied. The results of the exposure for different exposure intensities are always reproducible. An ageing of the LED module does not cause a spectral displacement, with the result that the wavelength emitted remains substantially constant. Further advantages of the additional exposure devices 2, 2' are that no unwanted irradiation can occur in the region of the additional exposure devices, that the linear LED arrangement 8 can be configured as desired in its length and can be utilized for exposure in its full length, and that it can be operated with low voltage and can be adjusted in the range from 0 to 100% of its luminous power.

What is claimed is:

1. A laser exposure apparatus for printing forms to be imagewise exposed, said apparatus comprising:

a laser light source for producing a beam of light;

a beam divider for splitting said beam of light into a writing beam and a reference beam;

means for modulating said writing beam;

a rotating polygonal mirror downstream of said modulating means and in the path of said writing beam;

a housing downstream of said polygonal mirror in the path of said writing beam and directly above said printing form, said housing comprising an exposure slit in the path of said writing beam so as to allow imagewise exposure of said printing form;

at least one additional exposure device comprising a light source which is disposed within said housing in the vicinity of said exposure slit, said additional exposure device radiating towards said printing form; and means for causing a delay between operation of said additional exposure device and imagewise exposure of said printing form by said writing beam, wherein each of the additional exposure devices comprises a linear LED arrangement comprising at least two rows of modules of light-emitting diodes as a radiation source, said linear LED arrangement having a lengthwise extent sufficient to expose a printing form moving past the additional exposure device and underneath the latter over its full area at 25% to 35% of its luminosity, each of said additional exposure devices further comprising a light scattering plate disposed on the underside of said housing, and covering said LED arrangement, and further comprising means for varying the luminosity of said LED arrangement over a power range of 0 to 100%.

2. A laser exposure apparatus as recited in claim 1, wherein said linear LED arrangement radiates in a wavelength region of about 565±20 nm, and wherein said radiated wavelength is greater than the wavelength of said laser.

3. A laser exposure apparatus as recited in claim 1, wherein said linear LED arrangement comprises rows of LED modules, said rows being offset with respect to one another, and wherein each individual module comprises a plurality of light-emitting diodes.

4. A laser exposure apparatus as recited in claim 3, wherein each of said individual modules contains four light-emitting diodes which are connected in series.

5. A laser exposure apparatus as recited in claim 3, wherein two modules are in each case connected in series and are controlled by an electrical circuit comprising in each case a transistor, a variable or fixed resistor and a common current source for all the modules which supplies a reference voltage $U_{ref}$ to the base of said transistors.

6. A laser exposure apparatus as recited in claim 5, wherein the bases of all the transistors are connected in parallel and all the resistors are connected in parallel between the emitters of the transistors and a ground conductor.

7. A laser exposure apparatus as recited in claim 5, wherein the reference voltage $U_{ref}$ is a square-wave voltage having a duty ratio of about 1:2.

8. A laser exposure apparatus as recited in claim 1, further comprising a sensor for measuring the luminosity of the linear LED arrangement in the additional exposure device.

9. A laser exposure apparatus as recited in claim 3, wherein the linear LED arrangement comprises individual segments which are plugged together by means of plug contacts to form a printed circuit board.

10. A laser exposure apparatus as recited in claim 9, wherein said segments have different lengths.

11. A laser exposure apparatus as recited in claim 8, wherein said sensor comprises a photodiode which is disposed within said housing.

12. A laser exposure apparatus for printing forms, said apparatus comprising:

a laser light source for producing a beam of light of a first wavelength and intensity;

means for splitting said beam of light into a writing beam and a reference beam;

means for producing a synchronizing signal in response to the position of said reference beam on a reference mask;

means for modulating said writing beam in response to said synchronizing signal;

means for directing said modulated writing beam onto a printing form so as to produce an imagewise exposure; and at least one diffuse light source of a second wavelength and intensity which is laterally displaced from said writing beam and above one of said forms for purposes of additionally exposing said printing form, wherein said diffuse light source comprises a housing, a plurality of light emitting diodes disposed within said housing and arranged into one or more linear rows, and a light diffuser on the portion of said housing which faces said printing form.

13. A laser exposure apparatus as recited in claim 12, further comprising means for varying the intensity of said light emitting diodes, wherein said plurality of light emitting diodes are divided into a plurality of modules, and each of said modules is connected in series to one other module and to said means for varying the intensity of said light emitting diodes.

14. A laser exposure apparatus as recited in claim 13, wherein said means for varying the intensity of said light emitting diodes comprises a common current source, a plurality of transistors, and a plurality of resistors, each of said series-connected modules being connected to the collector junction of one of said transistors, all base junctions of said transistors being connected in parallel with said common current source, and said resistors being connected in parallel between individual emitter junctions of said transistors and a common ground.

* * * * *